United States Patent
Hsu

(10) Patent No.: US 10,672,453 B2
(45) Date of Patent: Jun. 2, 2020

(54) VOLTAGE SYSTEM PROVIDING PUMP VOLTAGE FOR MEMORY DEVICE AND METHOD FOR OPERATING THE SAME

(71) Applicant: NANYA TECHNOLOGY CORP., New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/911,586

(22) Filed: Mar. 5, 2018

(65) Prior Publication Data

US 2019/0272864 A1 Sep. 5, 2019

Related U.S. Application Data

(60) Provisional application No. 62/609,868, filed on Dec. 22, 2017.

(51) Int. Cl.
*G11C 5/14* (2006.01)
*G11C 11/4074* (2006.01)
*G11C 29/56* (2006.01)

(52) U.S. Cl.
CPC .......... *G11C 11/4074* (2013.01); *G11C 5/145* (2013.01); *G11C 29/56* (2013.01)

(58) Field of Classification Search
CPC ...... G11C 11/4074; G11C 5/145; G11C 29/56
See application file for complete search history.

(56) References Cited

U.S. PATENT DOCUMENTS

| 5,319,601 | A  * | 6/1994  | Kawata    | G11C 5/147 327/143 |
| 5,602,794 | A  * | 2/1997  | Javanifard | G11C 5/145 257/299 |
| 10,049,714 | B1 * | 8/2018  | Lee       | G11C 11/4074 |
| 10,063,225 | B1 * | 8/2018  | Chen      | H03K 17/162 |
| 10,153,032 | B1 * | 12/2018 | Hsu       | G11C 11/4085 |
| 2002/0145464 | A1* | 10/2002 | Shor      | H02M 3/073 327/536 |
| 2006/0097813 | A1* | 5/2006  | Won       | H03K 3/011 331/185 |
| 2008/0080287 | A1* | 4/2008  | Kang      | G11C 5/145 365/226 |
| 2008/0117706 | A1* | 5/2008  | Choi      | G11C 5/145 365/226 |
| 2013/0107642 | A1* | 5/2013  | Chu       | G11C 5/145 365/189.09 |
| 2014/0029346 | A1* | 1/2014  | Tanzawa   | G11C 16/30 365/185.18 |

* cited by examiner

*Primary Examiner* — Khamdan N. Alrobaie

(74) *Attorney, Agent, or Firm* — Muncy, Geissler, Olds & Lowe, P.C.

(57) ABSTRACT

The present disclosure provides a charge pump system and a method of operating the same. The charge pump system includes a first pump circuit, a second pump circuit and a control device. The first pump circuit is configured to operate in a first voltage domain. The second pump circuit is configured to operate in a second voltage domain different from the first voltage domain. The control device is configured to selectively enable one of the first pump circuit and the second pump circuit based on an operating environment, wherein the one of the first pump circuit and the second pump circuit provides a pump voltage.

16 Claims, 9 Drawing Sheets

VOLTAGE SYSTEM PROVIDING PUMP VOLTAGE FOR MEMORY DEVICE AND METHOD FOR OPERATING THE SAME

PRIORITY CLAIM AND CROSS-REFERENCE

This application claims the benefit of provisional application Ser. 62/609,868 filed on Dec. 22, 2017 and entitled "DRAM," the disclosure of which is hereby incorporated by reference in its entirety.

TECHNICAL FIELD

The present disclosure relates to a voltage system, and more particularly, to a voltage system providing a pump voltage which serves as a supply voltage for the electrical components of a memory device, and to a method for operating the same.

DISCUSSION OF THE BACKGROUND

In many electronic circuits, charge pump circuits are utilized to generate a positive pumped voltage having an amplitude greater than that of a positive supply voltage, or to generate a negative pumped voltage from the positive supply voltage, as understood by those skilled in the art. For example, a typical application of a charge pump circuit is in a conventional dynamic random access memory ("DRAM"), to generate a boosted word line voltage VCCP having an amplitude greater than the amplitude of a positive supply voltage VCC or a negative bias voltage Vbb that is applied to the bodies of NMOS transistors in the DRAM. A charge pump may also be utilized in the generation of a programming voltage VPP utilized to program data into memory cells in non-volatile electrically block-erasable or "Flash" memories, as will be understood by those skilled in the art.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a charge pump system. The charge pump system includes a first pump circuit, a second pump circuit and a control device. The first pump circuit is configured to operate in a first voltage domain. The second pump circuit is configured to operate in a second voltage domain different from the first voltage domain. The control device is configured to selectively enable one of the first pump circuit and the second pump circuit based on an operating environment, wherein the one of the first pump circuit and the second pump circuit provides a pump voltage.

In some embodiments, the first voltage domain works under a first supply voltage, and the second voltage domain works under a second supply voltage lower than the first supply voltage.

In some embodiments, in testing of a dynamic random access memory (DRAM) including the charge pump system in a foundry, the control device enables the first pump circuit in response to an event in which a probe for testing is able to provide a pump current sufficient to drive devices in the DRAM when the probe is configured to provide the first supply voltage.

In some embodiments, in testing the DRAM, the control device enables the second pump circuit in response to an event in which the probe for testing is unable to provide the pump current sufficient to drive devices in the DRAM when the probe is configured to provide the first supply voltage.

In some embodiments, in a circumstance in which a user operates a dynamic random access memory (DRAM) including the charge pump system, the control device enables the first pump circuit when the first supply voltage is available for the user to operate the DRAM.

In some embodiments, in the circumstance in which the user operates the DRAM, the control device enables the second pump circuit when the first supply voltage is not available for the user to operate the DRAM.

In some embodiments, the first pump circuit includes a plurality of first sub pump circuits. The second pump circuit includes a plurality of second sub pump circuits. A quantity of the first sub pump circuits is less than that of the second sub pump circuits. A circuit structure of the first sub pump circuits is the same as that of the second sub pump circuits.

In some embodiments, parameters of active components and passive components of the first sub pump circuits are different from those of the second sub pump circuits.

Another aspect of the present disclosure provides a method of operating a charge pump system. The method comprises: providing a first pump circuit configured to operate in a first voltage domain; providing a second pump circuit configured to operate in a second voltage domain different from the first voltage domain; selectively enabling one of the first pump circuit and the second pump circuit based on an operating environment; and providing a pump voltage by the one of the first pump circuit and the second pump circuit.

In some embodiments, the first voltage domain works under a first supply voltage, and the second voltage domain works under a second supply voltage lower than the first supply voltage.

In some embodiments, the method is performed in a foundry in testing of a dynamic random access memory (DRAM) including the charge pump system in a foundry. The method further comprises: testing the DRAM by a probe; and enabling the first pump circuit in response to an event in which the probe is able to provide a pump current sufficient to drive devices in the DRAM when the probe is configured to provide the first supply voltage.

In some embodiments, the method further comprises: enabling the second pump circuit in response to an event in which the probe is unable to provide the pump current sufficient to drive devices in the DRAM when the probe is configured to provide the first supply voltage.

In some embodiments, the method is performed in a circumstance in which a user operates a dynamic random access memory (DRAM) including the charge pump system. The method further comprises: enabling the first pump circuit when the first supply voltage is available for the user to operate the DRAM.

In some embodiments, the method is performed in the circumstance in which the user operates the DRAM including the charge pump system. The method further comprises: enabling the second pump circuit when the first supply voltage is not available for the user to operate the DRAM.

In some embodiments, the method further comprises: providing the first pump circuit including a plurality of first sub pump circuits; and providing the second pump circuit including a plurality of second sub pump circuits, wherein a quantity of the first sub pump circuits is less than that of the second sub pump circuits, and wherein a circuit structure of the first sub pump circuits is the same as that of the second sub pump circuits.

In some embodiments, parameters of active components and passive components of the first sub pump circuits are different from those of the second sub pump circuits.

In the present disclosure, with the control device and the second pump circuit, the operator can disable the first pump circuit and enable the second pump circuit in response to an event in which the probe is unable to provide the current of 50 mA when the probe is configured to provide the voltage of 1.8V to satisfy the requirement of the first supply voltage of the first pump circuit. As a result, with the enable second pump circuit, the characteristic of the DRAM can be tested.

In some existing charge pump systems, only a charge pump operating in a single voltage domain is provided. It is assumed that a DRAM including such charge pump systems is sold to a customer (hereinafter, a user). A voltage of 1.8V may be not available for the user. Without the voltage of 1.8V serving as the supply voltage of 1.8V of the charge pump, the charge pump does not function. As a result, the DRAM can not be operated. Alternatively, in a foundry, an operator of the foundry would like to test the characteristics of the DRAM using a probe. However, the probe is unable to provide the current of 50 mA, even though the probe is able to be configured to provide the voltage of 1.8V as the supply voltage of the charge pump. As a result, the charge pump does not function, and therefore the characteristics of the DRAM cannot be obtained.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
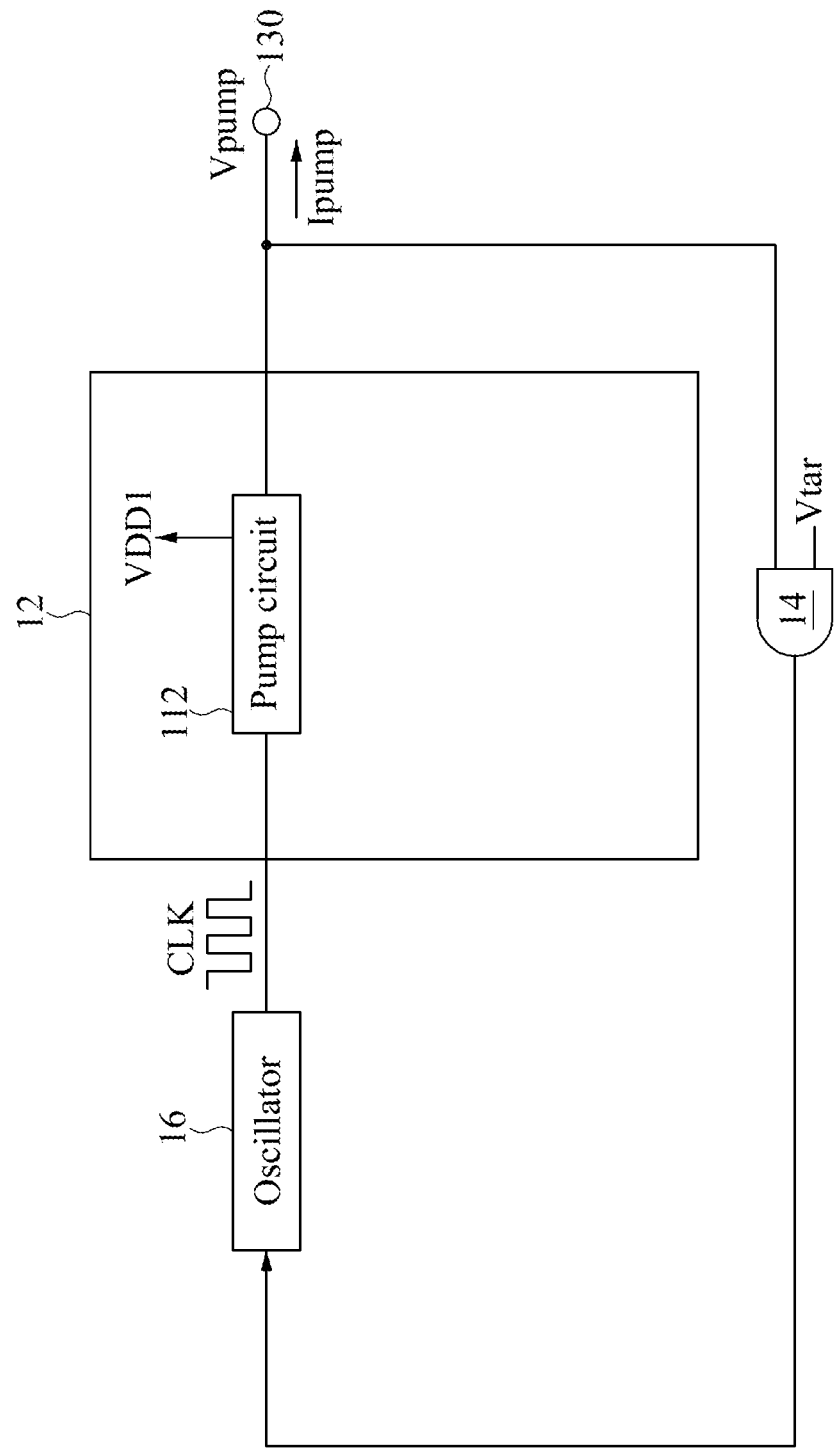
FIG. 1 is a schematic diagram of a comparative charge pump system.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a comparative charge pump system 10. Referring to FIG. 1, the charge pump system 10 includes a charge pump device 12 including a pump circuit 112, a comparator 14 and an oscillator 16.

The oscillator 16 functions to provide an oscillation signal by way of a clock signal CLK to the pump circuit 112.

The pump circuit 112 functions to operate in a voltage domain, which works under a single first supply voltage VDD1. The first supply voltage VDD1 serves as a supply voltage of the pump circuit 112. Moreover, the pump circuit 112 functions to, in response to the clock signal CLK, provide a pump voltage Vpump as a supply voltage of devices in a dynamic random access memory (DRAM), thereby providing a pump current Ipump to drive the devices in the DRAM.

The comparator 14 functions to compare the pump voltage Vpump at an output 130 of the charge pump system 10 to a target voltage Vtar, thereby determining whether the pump voltage Vpump becomes lower.

In operation, the oscillator 16 provides the pump circuit 112 with the clock signal CLK in response to the comparison result indicating that the pump voltage Vpump is lower than the target voltage Vtar. In response to the clock signal CLK, the pump circuit 112 operates, thereby increasing the pump voltage Vpump to the target voltage Vtar.

Conversely, in operation, the oscillator 16 does not provide the pump circuit 112 with the clock signal CLK in response to the comparison result indicating that the pump voltage Vpump is equal to or greater than the target voltage Vtar. In the absence of the clock signal CLK, the pump circuit 112 does not operate.

With the advancement of semiconductor process techniques, dimensions of DRAMs continue to decrease. For example, a DRAM including the charge pump system 10 is made of 20 nm. Devices of the DRAM in the 20 nm may require a supply voltage of, for example, about 3.6V. To avoid ineffective conversion efficiency, a circuit designer designs the pump circuit 112 with relatively few stages to boost a voltage to the supply voltage of, for example, about 3.6V, as will be shown in FIGS. 9 and 10. In such case, the pump circuit 112 operates under a relatively high voltage domain, which works under a relatively high voltage VDD1 of, for example, about 1.8V. Moreover, it is required to provide, for example, a current of 50 mA to drive the devices of the DRAM. Hence, the pump circuit 112 is required to provide the pump current Ipump of, for example, about 50 mA. However, in some circumstances, a voltage of 1.8V is not available for the DRAM. Alternatively, a voltage of 1.8V is available for the DRAM while a current of 50 mA is not available for the DRAM, which means that a voltage of 1.8V and a current of 50 mA are not available for the DRAM at the same time.

For example, the DRAM is sold to a customer (hereinafter, a user). However, a voltage of 1.8V is not available for the user. Without the voltage of 1.8V serving as the supply voltage of 1.8V of the pump circuit 112, the pump circuit 112 does not operate. As a result, the DRAM cannot be operated. Alternatively, in a foundry, an operator of the foundry would like to test the characteristics of the DRAM using a probe. However, the probe is unable to provide the current of 50 mA, when the probe is configured to provide the voltage of 1.8V to satisfy the requirement of the supply voltage of the pump circuit 112. As a result, the pump circuit 112 does not function, and therefore the characteristics of the DRAM cannot be obtained.

Figure 2:
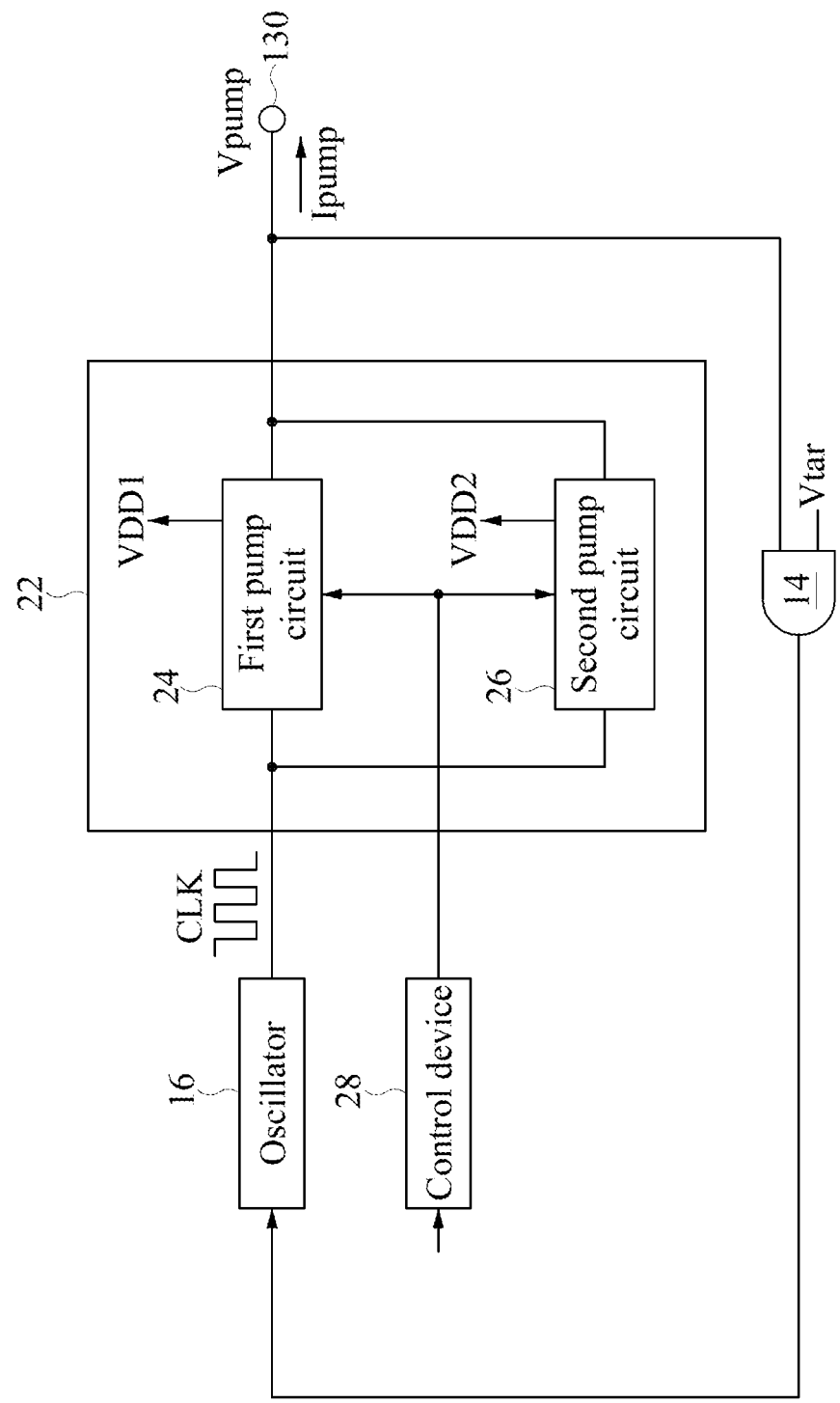
FIG. 2 is a schematic diagram of a charge pump system, in accordance with some embodiments of the present disclosure.

FIG. 2 is a schematic diagram of a charge pump system 10, in accordance with some embodiments of the present disclosure. Referring to FIG. 2, the charge pump system 20 is similar to the charge pump system 10 described and illustrated with reference to FIG. 1 except that, for example, the charge pump system 20 includes a pump device 22 including a first pump circuit 24 and a second pump circuit 26, and a control device 28.

The first pump circuit 24 functions to operate in a first voltage domain, which works under a first supply voltage VDD1. When the first pump circuit 24 is enabled, the first pump circuit 24 provides the pump voltage Vpump in response to the clock signal CLK. In some embodiments, the first supply voltage VDD1 ranges from about 1.8V to 2.5V.

The second pump circuit 26 functions to operate in a second voltage domain different from the first voltage domain. The second voltage domain works under a second supply voltage VDD2, which is lower than the first supply voltage VDD1. When the second pump circuit 26 is enabled, the second pump circuit 26 provides the pump voltage Vpump in response to the clock signal CLK. In some embodiments, the second supply voltage VDD2 includes about 1.2V.

The control device 28 functions to selectively enable one of the first pump circuit 24 and the second pump circuit 26 based on an operating environment.

In the present disclosure, with the control device 28 and the second pump circuit 26, an application of the charge pump system 20 is relatively flexible.

Figure 3:
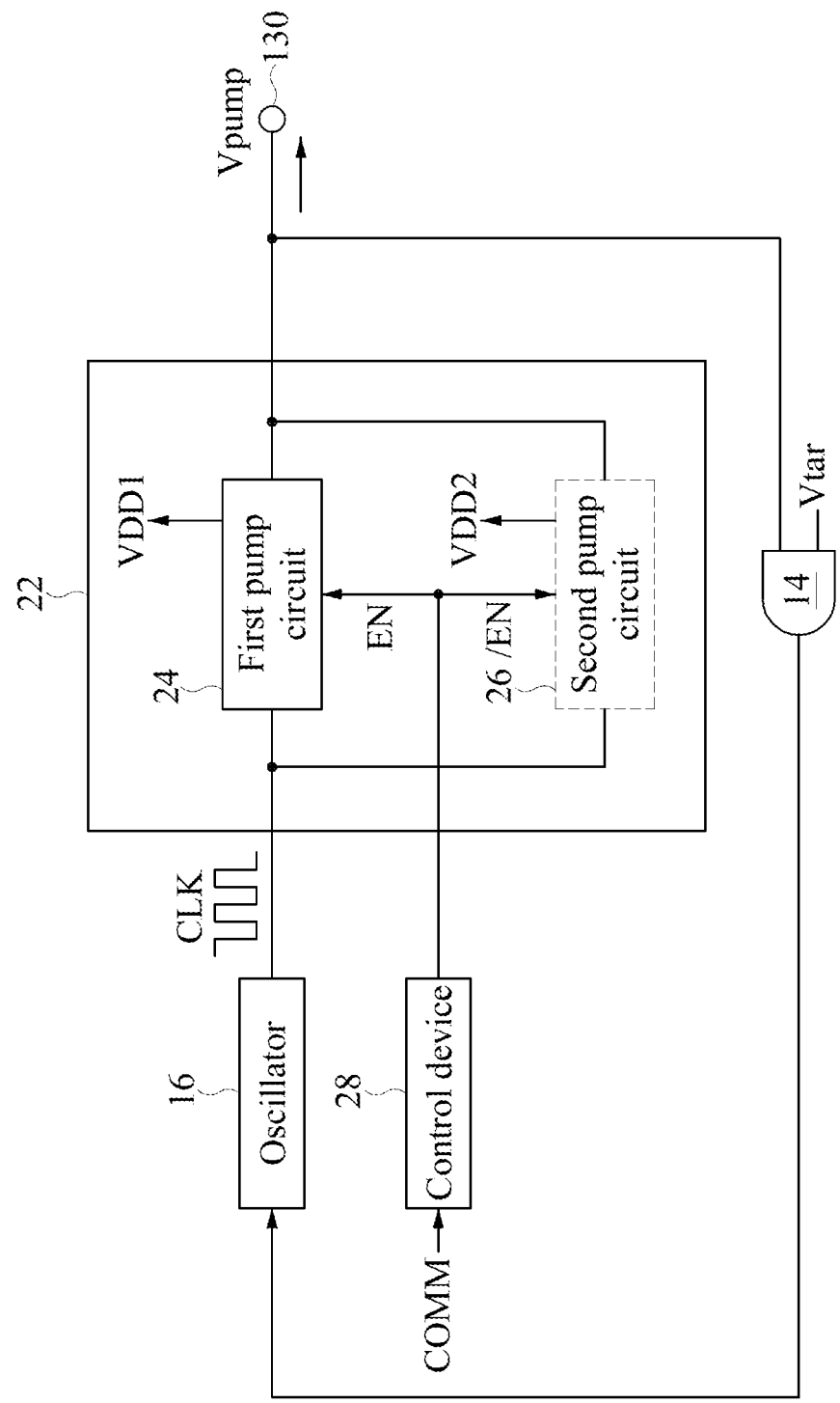
FIG. 3 is a schematic diagram illustrating an operation of the charge pump system shown in FIG. 2, in accordance with some embodiments of the present disclosure.

FIG. 3 is a schematic diagram illustrating an operation of the charge pump system 20 shown in FIG. 2, in accordance with some embodiments of the present disclosure. Referring to FIG. 3, the control device 28 receives a command to enable the first pump circuit 24 and disable the second pump circuit 26. Consequently, the control device 28 enables the first pump circuit 24, and disables the second pump circuit 26.

Since the second pump circuit 26 is disabled, even if the oscillator 16 provides the second pump circuit 26 with the clock signal CLK, the second pump circuit 26 is kept disabled and does not provide the pump voltage Vpump and the pump current Ipump.

Figure 4:
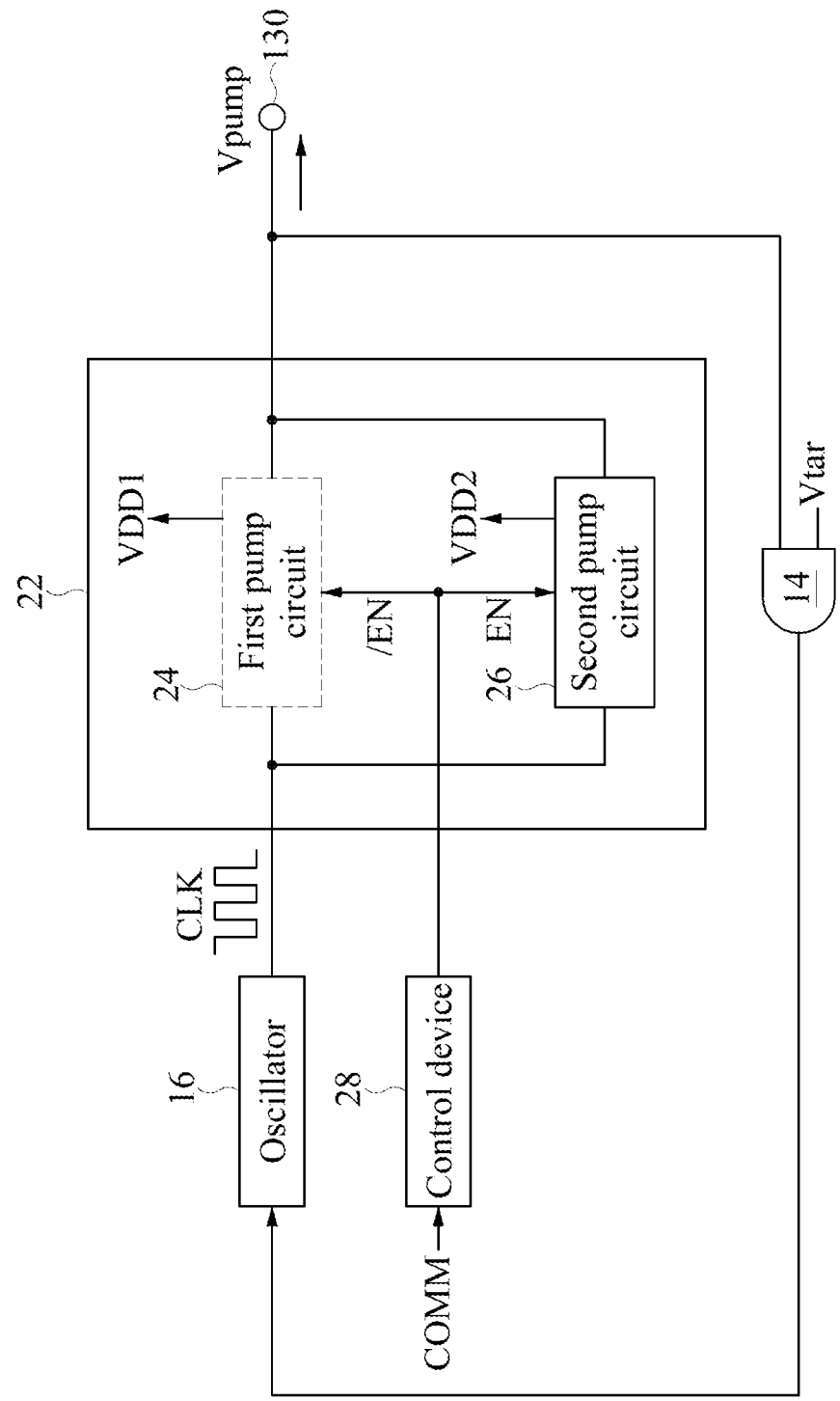
FIG. 4 is a schematic diagram illustrating another operation of the charge pump system shown in FIG. 2, in accordance with some embodiments of the present disclosure.

FIG. 4 is a schematic diagram illustrating another operation of the charge pump system 20 shown in FIG. 2, in accordance with some embodiments of the present disclosure. Referring to FIG. 4, the control device 28 receives a command to disable the first pump circuit 24 and enable the second pump circuit 26. Consequently, the control device 28 disables the first pump circuit 24, and enables the second pump circuit 26.

Since the first pump circuit 24 is disabled, even if the oscillator 16 provides the first pump circuit 24 with the clock signal CLK, the first pump circuit 24 is kept disabled and does not provide the pump voltage Vpump and the pump current Ipump.

Figure 5:
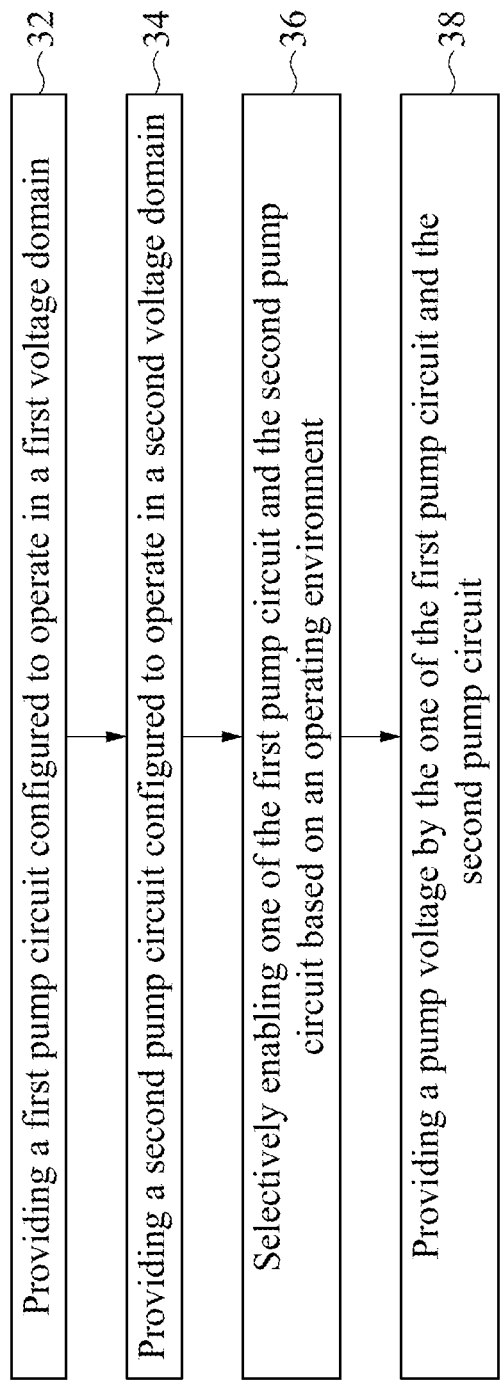
FIG. 5 is a flow chart of a method of operating a charge pump system, in accordance with some embodiments of the present disclosure.

FIG. 5 is a flow chart of a method 30 of operating a charge pump system, in accordance with some embodiments of the present disclosure. Referring to FIG. 5, the method 30 includes operations 32, 34, 36 and 38.

The method 30 begins with operation 32, in which a first pump circuit configured to operate in a first voltage domain is provided.

The method 30 proceeds to operation 34, in which a second pump circuit configured to operate in a second voltage domain is provided.

The method 30 continues with operation 36, in which one of the first pump circuit and the second pump circuit is selectively enabled based on an operating environment.

The method 30 proceeds to operation 38, in which a pump voltage is provided by the one of the first pump circuit and the second pump circuit.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

In the present disclosure, application of a DRAM including a charge pump system adopting the method 30 is relatively flexible.

Figure 6:
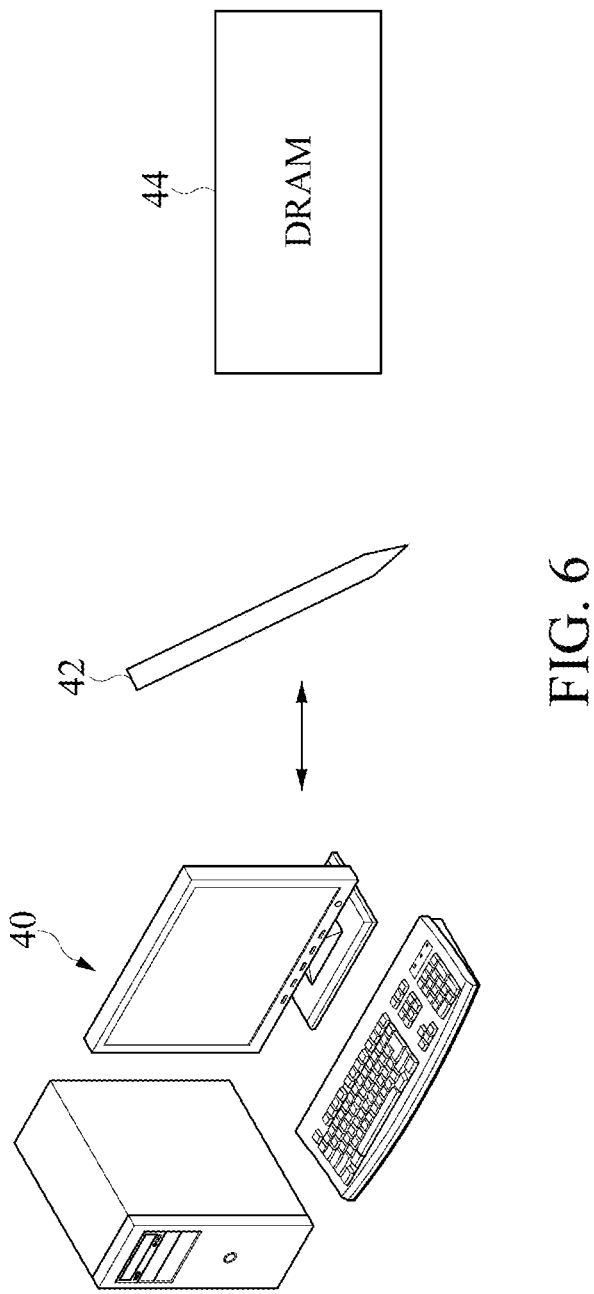
FIG. 6 is a schematic diagram illustrating a testing of a dynamic random access memory (DRAM) including the charge pump system shown in FIG. 2, in accordance with some embodiments of the present disclosure.

FIG. 6 is a schematic diagram illustrating a testing of a dynamic random access memory (DRAM) 44 including the charge pump system 20 shown in FIG. 2, in accordance with some embodiments of the present disclosure. Referring to FIG. 6, in a foundry, an operator of the foundry would like to test the DRAM 44 using a probe 42. The probe 42 transmits the testing result back to a work station 40 to analyze the characteristics of the DRAM 44.

It is assumed that the probe 42 is able to provide a pump current, for example, about 50 mA, sufficient to drive devices in the DRAM 44 when the probe 42 is configured to provide a voltage of, for example, 1.8V to satisfy the requirement of the first supply voltage VDD1 of, for example, 1.8V. In such case, the control device 28 enables the first pump circuit 24 and disables the second pump circuit 26 in response to such event. The first pump circuit 24 provides the pump voltage Vpump and the pump current Ipump.

However, in some circumstances, the probe 42 is unable to provide the pump current of, for example, 50 mA, sufficient to drive devices when the probe 42 is configured to provide a voltage of, for example, 1.8V to satisfy the requirement of the first supply voltage VDD1 of, for example, 1.8V.

Generally, a probe is able to provide the relatively high current when the probe is configured to provide the relatively low supply voltage.

Therefore, when encountering the above circumstance, the probe 42 is changed from providing 1.8V to providing 1.2V for seeking the relatively high current. The voltage of 1.2V is sufficient to serves as the second supply voltage VDD2 of the second pump circuit 26. Consequently, with the voltage of 1.2V, the second pump circuit 26 operates and the second pump circuit 26 is able to provide the pump current of 50 mA sufficient to drive the devices.

In the present disclosure, with the control device 28 and the second pump circuit 26, an operator can disable the first pump circuit 24 and enable the second pump circuit 26 in response to an event in which the probe 42 is unable to provide the current of 50 mA when the probe 42 is configured to provide the voltage of 1.8V to satisfy the requirement of the first supply voltage VDD1 of the first pump circuit 24. As a result, with the enable second pump circuit 26, the characteristic of the DRAM can be tested.

Figure 7:
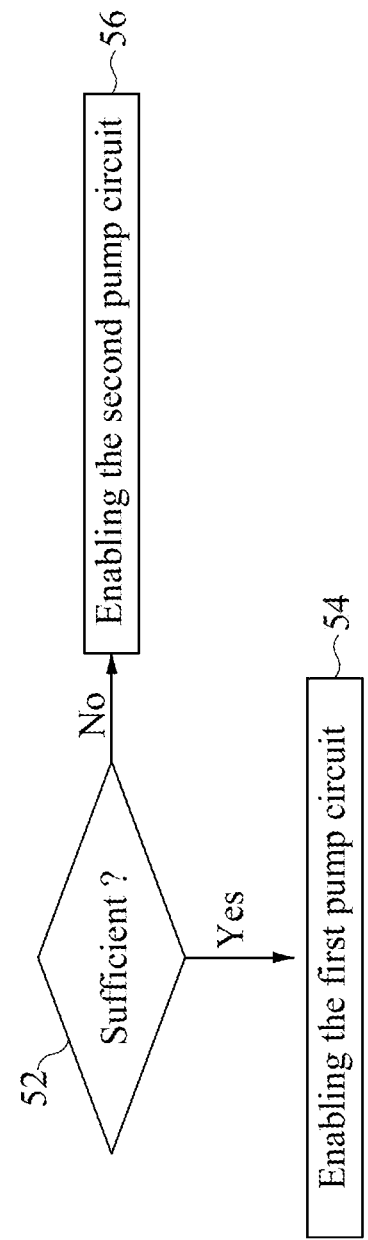
FIG. 7 is a flow chart of an operation of the method shown in FIG. 5, in accordance with some embodiments of the present disclosure.

FIG. 7 is a flow chart of operation 36 of the method 30 shown in FIG. 5, in accordance with some embodiments of the present disclosure. Referring to FIG. 7, operation 36 includes operations 52, 54 and 56.

The operation 36 begins with operation 52, in which, in testing of a DRAM, it is determined whether a probe for testing is able to provide a pump current sufficient to drive devices in the DRAM if the probe is configured to provide a first supply voltage. If affirmative, the operation 36 proceeds to operation 54, in which the first pump circuit is enabled. If negative, the operation 36 proceeds to operation 56, in which the second pump circuit is enabled.

The operation 36 of FIG. 7 is merely an example, and is not intended to limit the present disclosure beyond what is explicitly recited in the claims. Additional operations can be provided before, during, and after the operation 36, and some operations described can be replaced, eliminated, or moved around for additional embodiments of the method.

Figure 8:
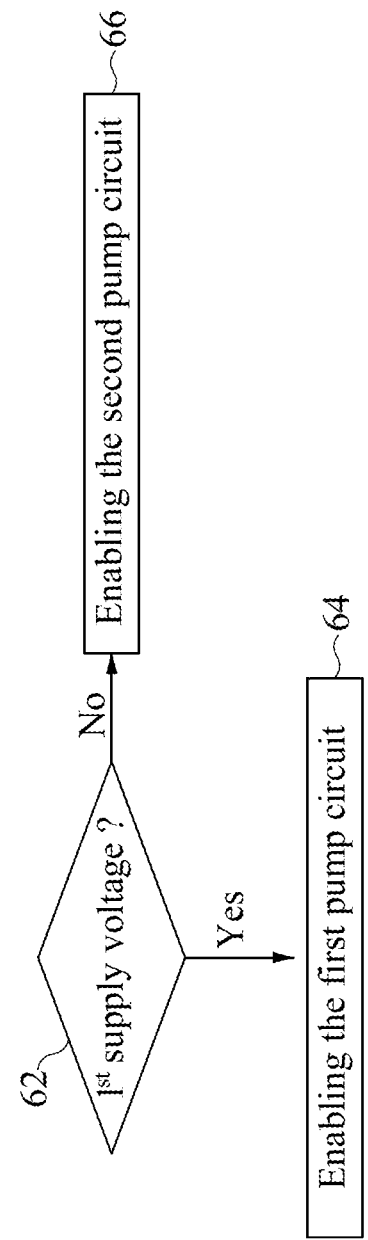
FIG. 8 is a flow chart of an operation of the method shown in FIG. 5, in accordance with some embodiments of the present disclosure.

FIG. 8 is a flow chart of operation 36 of the method 30 shown in FIG. 5, in accordance with some embodiments of the present disclosure. Referring to FIG. 8, operation 36 includes operations 62, 64 and 66.

The operation 36 begins with operation 62, in which in operating a DRAM, it is determined whether a user (or customer) is able to provide a first supply voltage. If affirmative, the operation 36 proceeds to operation 64, in which the first pump circuit is enabled and the second pump circuit is disabled. If negative, the operation 36 proceeds to operation 66, in which the second pump circuit is enabled and the first pump circuit is disabled.

The operation 36 of FIG. 8 is merely an example, and is not intended to limit the present disclosure beyond what is explicitly recited in the claims. Additional operations can be provided before, during, and after the operation 36, and some operations described can be replaced, eliminated, or moved around for additional embodiments of the method.

In the present disclosure, application of a DRAM including a charge pump system adopting the method 30 is relatively flexible.

Figure 9:
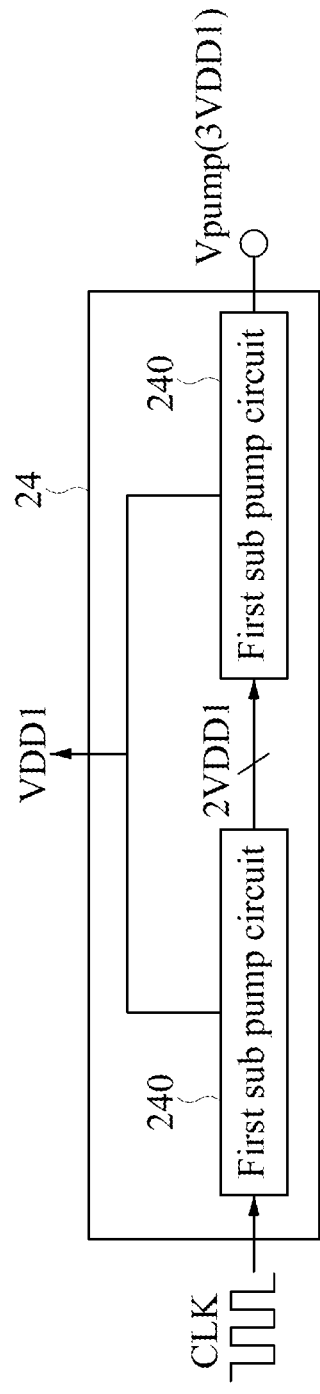
FIG. 9 is a schematic diagram of the first pump circuit shown in FIG. 2, in accordance with some embodiments of the present disclosure.

FIG. 9 is a schematic diagram of the first pump circuit 24 shown in FIG. 2, in accordance with some embodiments of the present disclosure. Referring to FIG. 9, the first pump circuit 24 includes two first sub pump circuits 240. The first sub pump circuits 240 in a first stage raise the first supply voltage VDD1 of, for example, 1.8V to twice the first supply voltage VDD1, or 3.6V (2*VDD1). The first sub pump circuits 240 in a second stage raise the voltage from 3.6V (2*VDD1) to three times the first supply voltage VDD1, or 5.4V (3*VDD1). The quantity of the first sub pump circuit 240 only serves as an example. The present disclosure is not limited thereto.

Figure 10:
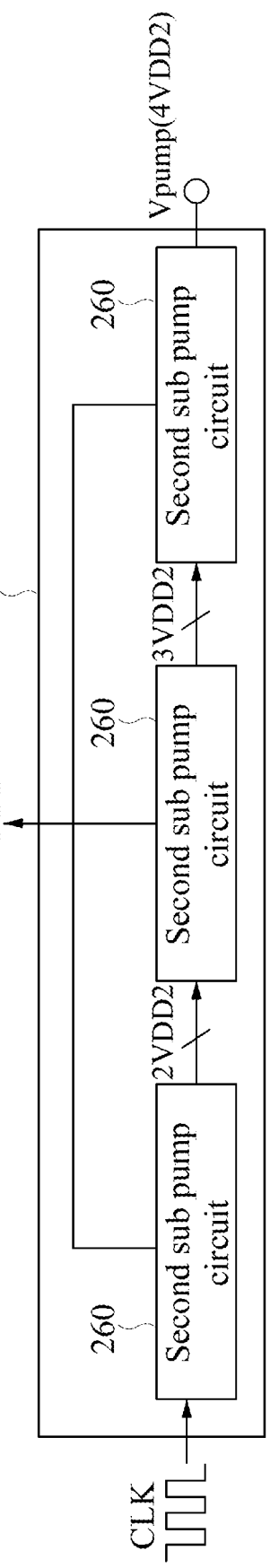
FIG. 10 is a schematic diagram of the second pump circuit shown in FIG. 2, in accordance with some embodiments of the present disclosure.

FIG. 10 is a schematic diagram of the second pump circuit 26 shown in FIG. 2, in accordance with some embodiments of the present disclosure. Referring to FIG. 10, the second pump circuit 26 includes three second sub pump circuits 260. The second sub pump circuits 260 in a first stage increase the second supply voltage VDD2 of, for example, 1.2V to twice the second supply voltage VDD2, or 2.4V (2*VDD2). The second sub pump circuits 260 in a second stage raise the voltage from 2.4V (2*VDD2) to three times the second supply voltage VDD2, or 3.6V (3*VDD2). The second sub pump circuits 260 in a third stage raise the voltage from 3.6V (3*VDD2) to four times the second supply voltage VDD2, or 4.8V (4*VDD2).

A quantity of the first sub pump circuits 240 is less than that of the second sub pump circuits 260. Therefore, conversion efficiency of the first pump circuit 24 is relatively effective. However, the first pump circuit 24 requires a higher supply voltage VDD1 of 1.8V.

A circuit structure of the first sub pump circuits 240 is the same as that of the second sub pump circuits 260. As such, circuit design of the charge device 22 is relatively simple. Moreover, parameters of active components and passive components of the first sub pump circuits are different from those of the second sub pump circuits, thereby individually optimizing the conversion efficiency of the first pump circuit 24 and the second pump circuit 26.

In the present disclosure, with the control device 28 and the second pump circuit 26, an operator can disable the first pump circuit 24 and enable the second pump circuit 26 in response to an event in which the probe 42 is unable to provide the current of 50 mA when the probe 42 is configured to provide the voltage of 1.8V to satisfy the requirement of the first supply voltage VDD1 of the first pump circuit 24. As a result, with the enable second pump circuit 26, the characteristic of the DRAM can be tested.

One aspect of the present disclosure provides a charge pump system. The charge pump system includes a first pump circuit, a second pump circuit and a control device. The first pump circuit is configured to operate in a first voltage domain. The second pump circuit is configured to operate in a second voltage domain different from the first voltage domain. The control device is configured to selectively enable one of the first pump circuit and the second pump circuit based on an operating environment, wherein the one of the first pump circuit and the second pump circuit provides a pump voltage.

Another aspect of the present disclosure provides a method of operating a charge pump system. The method comprises: providing a first pump circuit configured to operate in a first voltage domain; providing a second pump circuit configured to operate in a second voltage domain different from the first voltage domain; selectively enabling one of the first pump circuit and the second pump circuit based on an operating environment; and providing a pump voltage by the one of the first pump circuit and the second pump circuit.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A charge pump system, comprising:
    a first pump circuit configured to operate in a first voltage domain, wherein the first voltage domain works under a first supply voltage;
    a second pump circuit configured to operate in a second voltage domain different from the first voltage domain;
    a control device configured to selectively enable one of the first pump circuit and the second pump circuit based on a determination of whether a voltage supplied to the charge pump system is sufficient to the first supply voltage, wherein the one of the first pump circuit and the second pump circuit being enabled provides a pump voltage;
    a comparator configured to compare the pump voltage at an output of the charge pump system to a target voltage; and
    an oscillator electrically coupled to first pump circuit, the second pump circuit and the comparator and configured to provide a clock signal to the first pump circuit and the second pump circuit in response to a comparison result indicating that the pump voltage is lower than the target voltage.

2. The charge pump system of claim 1, wherein the second voltage domain works under a second supply voltage lower than the first supply voltage.

3. The charge pump system of claim 2, wherein in analyzing characteristics of a dynamic random access memory (DRAM), including the charge pump system, the control device enables the first pump circuit in response to an event in which a probe for testing is able to provide a pump current sufficient to drive devices in the DRAM when the probe is configured to provide the first supply voltage.

4. The charge pump system of claim 3, wherein in analyzing characteristics of the DRAM, the control device enables the second pump circuit in response to an event in which the probe for testing is unable to provide the pump current sufficient to drive devices in the DRAM when the probe is configured to provide the first supply voltage.

5. The charge pump system of claim 2, wherein in a circumstance in which a user operates a dynamic random access memory (DRAM) including the charge pump system, the control device enables the first pump circuit when the first supply voltage is available for the user to operate the DRAM.

6. The charge pump system of claim 5, wherein in the circumstance in which the user operates the DRAM, the control device enables the second pump circuit when the first supply voltage is not available for the user to operate the DRAM.

7. The charge pump system of claim 2,
    wherein the first pump circuit includes a plurality of first sub pump circuits, and
    wherein the second pump circuit includes a plurality of second sub pump circuits,
    wherein a quantity of the first sub pump circuits is less than that of the second sub pump circuits, and
    wherein a circuit structure of the first sub pump circuits is the same as that of the second sub pump circuits.

8. The charge pump system of claim 7, wherein parameters of active components and passive components of the first sub pump circuits are different from those of the second sub pump circuits.

9. A method of operating a charge pump system, the method comprising:
    providing a first pump circuit configured to operate in a first voltage domain, wherein the first voltage domain works under a first supply voltage;
    providing a second pump circuit configured to operate in a second voltage domain different from the first voltage domain;
    selectively enabling one of the first pump circuit and the second pump circuit based on a determination of whether a voltage supplied to the charge pump system is sufficient to the first supply voltage;
    providing a pump voltage by the one of the first pump circuit and the second pump circuit;
    providing a comparator configured to compare the pump voltage to a target voltage; and
    providing an oscillator configured to provide a clock signal to the first pump circuit and the second pump circuit in response to a comparison result indicating that the pump voltage is lower than the target voltage.

10. The method of claim 9, wherein the second voltage domain works under a second supply voltage lower than the first supply voltage.

11. The method of claim 10, wherein the method is performed in analyzing characteristics of a dynamic random access memory (DRAM) including the charge pump system, the method further comprising:
    testing the DRAM by a probe; and
    enabling the first pump circuit in response to an event in which the probe is able to provide a pump current sufficient to drive devices in the DRAM when the probe is configured to provide the first supply voltage.

12. The method of claim 11, further comprising:
    enabling the second pump circuit in response to an event in which the probe is unable to provide the pump current sufficient to drive devices in the DRAM when the probe is configured to provide the first supply voltage.

13. The method of claim 10, wherein the method is performed in a circumstance in which a user operates a dynamic random access memory (DRAM) including the charge pump system, the method further comprising:
- enabling the first pump circuit when the first supply voltage is available for the user to operate the DRAM.

14. The method of claim 13, wherein the method is performed in the circumstance in which the user operates the DRAM, the method further comprising:
- enabling the second pump circuit when the first supply voltage is not available for the user to operate the DRAM.

15. The method of claim 10, further comprising:
- providing the first pump circuit including a plurality of first sub pump circuits; and
- providing the second pump circuit including a plurality of second sub pump circuits,
- wherein a quantity of the first sub pump circuits is less than that of the second sub pump circuits, and
- wherein a circuit structure of the first sub pump circuits is the same as that of the second sub pump circuits.

16. The method of claim 15, wherein parameters of active components and passive components of the first sub pump circuits are different from those of the second sub pump circuits.

* * * * *